United States Patent
Iwata et al.

(10) Patent No.: US 6,485,573 B2
(45) Date of Patent: Nov. 26, 2002

(54) APPARATUS FOR REDUCED-PRESSURE EPITAXIAL GROWTH AND METHOD OF CONTROLLING THE APPARATUS

(75) Inventors: Katsuyuki Iwata, Hamamatsu (JP); Tadashi Ohashi, Kudamatsu (JP); Shyuji Tobashi, Hiratsuka (JP); Shinichi Mitani, Numazu (JP); Hideki Arai, Numazu (JP); Hideki Ito, Numazu (JP)

(73) Assignees: Toshiba Ceramics Co., Ltd., Tokyo (JP); Toshiba Kikai Kabushikikaisha, Tokyo (JP)

( * ) Notice: Subject to any disclaimer, the term of this patent is extended or adjusted under 35 U.S.C. 154(b) by 0 days.

(21) Appl. No.: 09/855,654

(22) Filed: May 16, 2001

(65) Prior Publication Data

US 2001/0052316 A1 Dec. 20, 2001

(30) Foreign Application Priority Data

Jun. 19, 2000 (JP) ........................ 2000-182598

(51) Int. Cl.$^7$ .............................................. C23C 16/00
(52) U.S. Cl. ..................................................... 118/730
(58) Field of Search ................................. 118/728, 729, 118/730

(56) References Cited

U.S. PATENT DOCUMENTS

| | | | |
|---|---|---|---|
| 4,579,080 A | * 4/1986 | Martin et al. | 118/500 |
| 4,839,145 A | * 6/1989 | Gale et al. | 422/245 |
| 5,002,011 A | * 3/1991 | Ohmine et al. | 118/725 |
| 5,062,386 A | * 11/1991 | Christensen | 118/725 |
| 5,314,541 A | * 5/1994 | Saito et al. | 118/725 |
| 5,364,488 A | * 11/1994 | Minato et al. | 156/345 |
| 5,518,549 A | * 5/1996 | Hellwig | 118/728 |
| 5,534,072 A | * 7/1996 | Mizuno et al. | 118/728 |
| 5,578,132 A | * 11/1996 | Yamaga et al. | 118/724 |
| 5,599,397 A | * 2/1997 | Anderson et al. | 118/728 |
| 5,849,076 A | * 12/1998 | Gaylord et al. | 117/85 |
| 5,902,407 A | * 5/1999 | deBoer et al. | 118/725 |
| 6,184,154 B1 | * 2/2001 | Dietze et al. | 438/762 |

\* cited by examiner

*Primary Examiner*—Benjamin L. Utech
*Assistant Examiner*—Matthew A. Anderson
(74) *Attorney, Agent, or Firm*—Foley & Lardner

(57) ABSTRACT

An apparatus for reduced-pressure gaseous phase epitaxial growth by suppressing contamination upon the machine parts constituting the rotary mechanical portion and suppressing contamination upon the semiconductor wafer by maintaining the pressure in the rotary mechanical portion to lie within a particular range, and a method of controlling the above apparatus. The apparatus comprises a purging gas introduction pipe 6 for purging the interior of the rotary mechanical portion, a purging gas exhaust pipe 7 for exhausting the gas introduced through the purging gas introduction pipe, a pressure adjusting valve 41 provided in the purging gas exhaust pipe, a pressure gauge 21 for detecting the pressure in the rotary mechanical portion, and an arithmetic/control unit 31 for executing an arithmetic operation based upon the detected pressure and for controlling the opening degree of the pressure adjusting valve 41 provided in the purging gas exhaust pipe, so that the pressure in the rotary mechanical portion assumes a proper value.

4 Claims, 2 Drawing Sheets

CHANGE IN THE Fe CONTAMINATION

CHANGE IN THE AMOUNT OF THE
REACTION PRODUCT

APPARATUS FOR REDUCED-PRESSURE EPITAXIAL GROWTH AND METHOD OF CONTROLLING THE APPARATUS

BACKGROUND OF THE INVENTION

1. Field of the Invention

The present invention relates to an apparatus for reduced-pressure epitaxial growth and to a method of controlling the apparatus. More specifically, the invention relates to an apparatus for reduced-pressure gaseous phase epitaxial growth maintaining, in a predetermined range, the pressure in the rotary mechanical portion of a susceptor on which is placed a semiconductor substrate such as silicon wafer and to a method of controlling the apparatus.

2. Prior Art

A reduced-pressure DVD apparatus is usually used for epitaxially growing a single crystal thin film on a semiconductor substrate such as silicon wafer in gaseous phase.

The conventional apparatus for reduced-pressure epitaxial growth will be described in detail with reference to FIG. 2. The apparatus for reduced-pressure epitaxial growth includes a processing furnace 1, a susceptor 9 that rotates while placing thereon a semiconductor wafer 8, a rotary mechanical portion 5 for rotating the susceptor 9, a gas introduction pipe 11 for introducing a film-forming gas into the processing furnace, a gas exhaust pipe 10 for exhausting the film-forming gas, a pressure adjusting valve 4 provided in the gas exhaust pipe 10 for exhausting the film-forming gas, a pressure gauge 2 for detecting the pressure in the processing furnace, and an arithmetic/control unit 3 for executing the arithmetic operation based on the pressure that is detected to control the opening degree of the pressure adjusting valve 4 provided in the gas exhaust pipe 10 that exhausts the film-forming gas, so that the pressure in the processing furnace assumes a proper value.

Being constituted as described above, the pressure in the processing furnace 1 is controlled to assume a predetermined value, and the semiconductor wafer 8 is processed under the predetermined pressure.

Further, a purging gas introduction pipe 6 and a purging gas exhaust pipe 7 are arranged for the rotary mechanical portion 5 disposed in the lower part of the processing furnace 1, and an inert gas such as argon gas is introduced through the purging gas introduction pipe 6 to purge the interior of the rotary mechanical portion 5. After having purged the interior of the rotary mechanical portion 5, the inert gas is exhausted through the purging gas exhaust pipe 7. Thus, the interior of the rotary mechanical portion 5 is purged with the inert gas to suppress metallic contamination generated by the rotary mechanical portion 5 from migrating into the processing furnace 1 and, hence, to suppress the processing furnace and the semiconductor wafer from being contaminated with metallic contaminants.

In the conventional apparatus for reduced-pressure epitaxial growth, however, the pressure in the rotary mechanical portion has not been controlled.

In the conventional apparatus, therefore, when a relationship between the pressure ($p_1$) in the processing furnace and the pressure ($p_2$) in the rotary mechanical portion is, for example, $p_1 > p_2$, the reactive gas (film-forming gas) used in the processing furnace enters into the rotary mechanical portion to contaminate machine parts such as bearings constituting the mechanical portion and the encoder, making it necessary to frequently clean the rotary mechanical portion. On the other hand, when the relationship between $p_1$ and $p_2$ is $p_1 < p_2$ contrary to the above, the purging gas that has passed through the rotary mechanical portion and is contaminated with metals infiltrates into the processing furnace, and the semiconductor wafer being processed is often contaminated with metals.

In order to decrease the frequency for cleaning the interior of the rotary mechanical portion as much as possible and to minimize the metallic contamination upon the semiconductor wafer being processed, maintaining $p_1 = p_2$ would be effective without, however, proper and explicit ranges for the two. Even when $p_2$ could be set to lie in a proper range, a change in the pressure $p_1$ in the processing furnace due to a change in the flow rate of gas in the processing furnace causes the pressure $p_2$ to lie outside the proper range, and the above-mentioned harmful influence occurs.

In the conventional apparatus, it can be contrived to prevent the above-mentioned harmful influence by completely sealing the processing furnace from the rotary mechanical portion. In practice, however, a high sealing performance is not accomplished due to the structure of the apparatus; i.e., the rotary shaft for rotating the susceptor is extending into the processing furnace from the rotary mechanical portion. If it is attempted to maintain a highly reliable sealing performance, a new problem arouses in that the structure of the apparatus becomes complex and the apparatus itself becomes expensive.

SUMMARY OF THE INVENTION

The present invention was accomplished in view of the above technical assignment inherent in the prior art, and has an object of providing an apparatus for reduced-pressure gaseous phase epitaxial growth by suppressing contamination upon the machine parts constituting the rotary mechanical portion and suppressing contamination upon the semiconductor wafer by maintaining the pressure in the rotary mechanical portion to lie within a particular range, and a method of controlling the above apparatus.

In order to solve the above technical assignment, the apparatus for reduced-pressure epitaxial growth according to the present invention comprises a processing furnace, a susceptor disposed in the processing furnace and rotates while placing a semiconductor wafer thereon, a rotary mechanical portion for rotating the sucseptor, a gas introduction pipe for introducing a film-forming gas into the processing furnace, and a gas exhaust pipe for exhausting the film-forming gas, the apparatus for reduced-pressure epitaxial growth further comprising a purging gas introduction pipe for purging the interior of the rotary mechanical portion, a purging gas exhaust pipe for exhausting the gas introduced through the purging gas introduction pipe, a pressure adjusting valve provided in the purging gas exhaust pipe, a pressure gauge for detecting the pressure in the rotary mechanical portion, and an arithmetic/control unit for executing an arithmetic operation based upon the detected pressure and for controlling the opening degree of the pressure adjusting valve provided in the purging gas exhaust pipe, so that the pressure in the rotary mechanical portion assumes a proper value.

As described above, the apparatus for reduced-pressure epitaxial growth according to the present invention includes the pressure adjusting valve provided in the purging gas exhaust pipe, the pressure gauge for detecting the pressure in the rotary mechanical portion, and the arithmetic/control unit for executing an arithmetic operation based upon the detected pressure and for controlling the opening degree of the pressure adjusting valve provided in the purging gas exhaust pipe, so that the pressure in the rotary mechanical portion assumes a proper value. Therefore, the apparatus for reduced-pressure epitaxial growth of the invention makes it possible to control the pressure in the rotary mechanical portion to lie in a desired range, that could not be controlled by the conventional apparatus.

That is, the apparatus for reduced-pressure epitaxial growth according to the present invention suppresses the infiltration of the film-forming gas (reactive gas, etc.) into the rotary mechanical portion from the processing furnace, decreasing the contamination in the rotary mechanical portion. Besides, infiltration of the purging gas into the processing furnace from the rotary mechanical portion is suppressed, decreasing contamination for the semiconductor wafer.

Here, it is desired to provide a pressure gauge for detecting the pressure in the processing furnace, a pressure gauge for detecting the pressure in the rotary mechanical portion, and an arithmetic/control unit for executing the arithmetic operation based on the pressure in the processing furnace and the pressure in the rotary mechanical portion that are detected and for controlling the opening degree of the pressure adjusting valve provided in the purging gas exhaust pipe, so that the pressure in the rotary mechanical portion assumes a proper value.

Thus, provision is made of the pressure gauge for detecting the pressure in the processing furnace, the pressure gauge for detecting the pressure in the rotary mechanical portion, and the arithmetic/control unit for executing the arithmetic operation based on the pressure in the processing furnace and the pressure in the rotary mechanical portion that are detected and for controlling the opening degree of the pressure adjusting valve provided in the purging gas exhaust pipe, so that the pressure in the rotary mechanical portion assumes a proper value. Accordingly, even when the pressure in the processing furnace changes, the pressure in the rotary mechanical portion can be adjusted to assume a proper value.

It is desired that the apparatus for reduced-pressure gaseous phase epitaxial growth includes a pressure adjusting valve provided in the gas exhaust pipe for exhausting the film-forming gas, a pressure gauge for detecting the pressure in the processing furnace, and an arithmetic/control unit for executing the arithmetic operation based on the pressure in the processing furnace and the pressure in the rotary mechanical portion that are detected and for controlling the opening degree of the pressure adjusting valve provided in the purging gas exhaust pipe, so that the pressure in the rotary mechanical portion assumes a proper value.

In the method of controlling the apparatus for reduced-pressure epitaxial growth of the invention for solving the above-mentioned technical assignment, further, when the pressure in the processing furnace is denoted by $p_1$ and the pressure in the rotary mechanical portion by $p_2$, then a ratio of $p_2$ to $p_1$ ($P=p_2/p_1$) is controlled to lie in a range $0.9 \leq P \leq 1.0$.

DESCRIPTION OF THE PREFERRED EMBODIMENT

An embodiment of the invention will now be concretely described with reference to FIG. 1.

Figure 1:
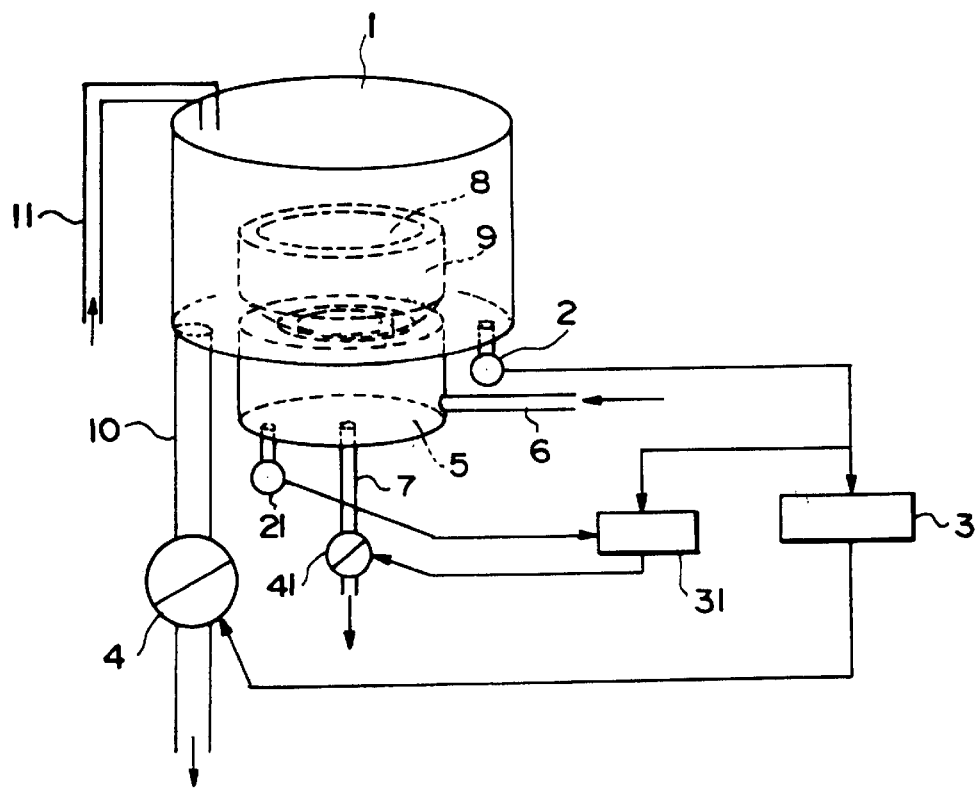
FIG. 1 is a diagram schematically illustrating an apparatus for reduced-pressure epitaxial growth according to the present invention.
Figure 2:
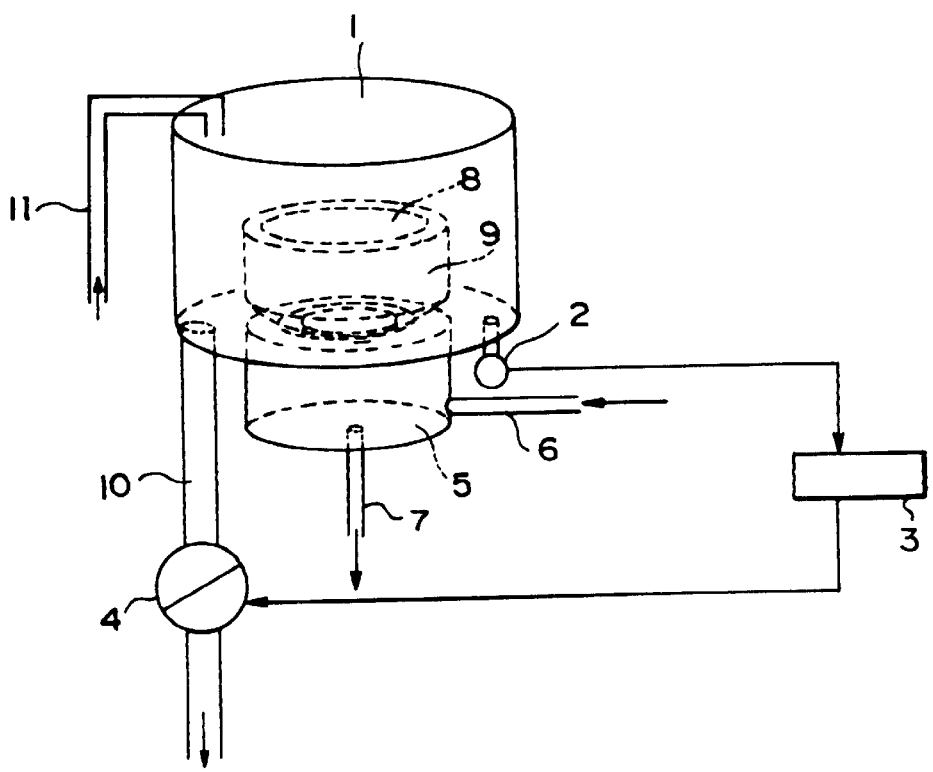
FIG. 2 is a diagram schematically illustrating a conventional apparatus for reduced-pressure epitaxial growth.

FIG. 1 is a diagram schematically illustrating an apparatus for reduced-pressure epitaxial growth according to the present invention.

As shown in FIG. 1, the apparatus for reduced-pressure epitaxial growth according to the present invention includes a processing furnace 1, a susceptor 9 disposed in the processing furnace and rotates while placing a semiconductor wafer 8 thereon, a rotary mechanical portion 5 for rotating the susceptor 9, a gas introduction pipe 11 for introducing a film-forming gas (reactive gas, etc.) into the processing furnace, a gas exhaust pipe 10 for exhausting the film-forming gas, a pressure adjusting valve 4 provided in the gas discharge pipe 10 for discharging the film-forming gas, a pressure gauge 2 for detecting the pressure in the processing furnace and an arithmetic/control unit 3 for executing the arithmetic operation based on the detected pressure and for controlling the opening degree of the pressure adjusting valve 4 provided in the gas exhaust pipe 10 for exhausting the film-forming gas, so that the pressure in the processing furnace assumes a proper value, like the conventional apparatus for reduced-pressure epitaxial growth.

Being constituted as described above, the pressure in the processing furnace 1 is controlled to assume a predetermined value, and the semiconductor wafer 8 is processed under the predetermined pressure.

Further, a purging gas introduction pipe 6 and a purging gas exhaust pipe 7 are arranged for the rotary mechanical portion 5 installed on the lower part of the processing furnace 1, and an inert gas such as argon gas is introduced through the purging gas introduction pipe 6 to purge the interior of the rotary mechanical portion 5. After having purged the interior of the rotary mechanical portion 5, the inert gas is exhausted through the purging gas exhaust pipe 7.

A pressure adjusting valve 41 is provided in the purging gas exhaust pipe 7. There is further provided a pressure gauge 21 for detecting the pressure in the rotary mechanical portion 5. Provision is further made of an arithmetic/control unit 31 for executing an arithmetic operation based on the pressure detected by the pressure gauge 21 and for controlling the opening degree of the pressure adjusting valve 41 provided in the purging gas exhaust pipe 7, so that the pressure in the rotary mechanical portion 5 assumes a proper value.

The arithmetic/control unit 31 receives data from the pressure gauge 21 as well as data from the pressure gauge 2 that detects the pressure in the processing furnace 1, executes the arithmetic operation based on the pressure in the processing furnace 1 and on the pressure in the rotary mechanical portion 5 that are detected, and controls the opening degree of the pressure adjusting valve 414 provided in the purging gas exhaust pipe 7, so that the pressure in the rotary mechanical portion 5 assumes a proper value.

Next, described below is the operation of the thus constituted apparatus for reduced-pressure epitaxial growth.

In the processing furnace 1, the semiconductor wafer 8 to be processed is placed on the susceptor 9 and is rotated. Here, the film-forming gas such as reaction gas, dopant gas or carrier gas is fed from the upper side in the processing furnace 1 onto the upper surface of the semiconductor wafer 8. The film-forming gas flows down to the bottom portion of the processing furnace 1 while reacting on the surface of the semiconductor wafer 8 epitaxially growing a single crystal film on the surface thereof, and is exhausted through the film-forming gas exhaust pipe 10.

Here, the pressure in the processing furnace is detected by the pressure gauge 2 provided on the bottom of the processing furnace 1, and the measured data is input to an arithmetic/control unit 3. The arithmetic/control unit 3 sends, to the pressure control valve 4, a control signal for adjusting the opening degree of the pressure control valve 4 to accomplish a pressure most suited for processing the semiconductor wafer 8. As a result, the opening degree of the pressure control valve 4 is adjusted, and the pressure in the processing furnace 1 is automatically controlled to assume an optimum value.

The pressure in the rotary mechanical portion 5 is detected by the pressure gauge 21 provided in the rotary mechanical portion 5, and the measured data is input to the arithmetic/control unit 31. The arithmetic/control unit 31 further receives the data of pressure in the processing furnace 1 detected by the pressure gauge 2 provided on the bottom of the processing furnace 1.

Based on the pressure in the rotary mechanical portion 5 and on the pressure in the processing furnace 1, the arithmetic/control unit 31 sends, to the pressure control valve 41, a control signal for adjusting the opening degree of the pressure control valve 41, so that the pressure in the rotary mechanical portion 5 becomes an optimum pressure. As a result, the opening degree of the pressure control valve 41 is adjusted, and the pressure in the rotary mechanical portion 5 is automatically controlled to assume an optimum value.

Thus, the opening degree of the pressure control valve 41 is adjusted based on the pressure in the rotary mechanical portion 5 and on the pressure in the processing furnace 1. Even when the pressure in the processing furnace 1 has changed, therefore, an optimum pressure can be obtained in the rotary mechanical portion 5.

If concretely described, the pressure control valve 41 is so controlled as to satisfy the following relationship between the pressure in the processing furnace 1 and the pressure in the rotary mechanical portion 5.

That is, when the pressure in the processing furnace is denoted by $p_1$ and the pressure in the rotary mechanical portion is denoted by $p_2$, the pressure control valve 41 is so controlled that the ratio P of $p_2$ to $p_1$ ($P=p_2/p_1$) satisfies a relationship $0.9 \leq P \leq 1.0$.

This control operation is carried out because of the reason that when the pressure in the processing furnace 1 is higher than the pressure in the rotary mechanical portion 5 ($p_1>p_2$), the reactive gas used in the processing furnace enters into the rotary mechanical portion to contaminate machine parts such as bearings and encoder, making it necessary to frequently clean the parts of the rotary mechanical portion, which is not desirable.

When the pressure in the processing furnace 1 is lower than the pressure in the rotary mechanical portion 5 by more than 10% ($p_1<0.9\ p_2$), on the other hand, the reactive gas is prevented from entering into the rotary mechanical portion 5, and the rotary mechanical portion 5 needs be cleaned less frequently. However, the gas that has passed through the rotary mechanical portion and is contaminated with metals infiltrates into the processing furnace 1 bringing about such an inconvenience that the semiconductor wafer to be processed is contaminated with metals.

According to the present invention as will become obvious from an Example appearing later, therefore, controlling and maintaining the pressure in the rotary mechanical portion to lie in the above-specified range is particularly important from the standpoint of suppressing the contamination in the rotary mechanical portion to such a degree that a necessity of cleaning is decreased down to a frequency which is tolerable from the standpoint of production and of suppressing the contamination of the semiconductor wafer with metals down to a value that can be permitted in managing the quality.

In the gaseous phase epitaxial growth by using the apparatus for reduced-pressure epitaxial growth of the invention, the operational conditions other than the pressure conditions are not much different from those of the existing growing method, and nearly the same growing conditions can be employed.

Further, the reaction temperature in the processing furnace varies depending upon the kind of the semiconductor wafer and the kind of the single crystal film epitaxially grown. When, for example, a silicon film is epitaxially grown on the silicon wafer, there is usually employed a temperature which is higher than about 1100° C. but is lower than about 1200° C. Further, the semiconductor substrate used for forming a film is typically a silicon wafer. It is, however, also allowable to use a semiconductor substrate other than silicon, such as silicon carbide substrate and the like substrate.

The thin film formed on the semiconductor substrate is, most generally, a silicon film, though any other thin film such as GaAs film can be used without trouble.

There is no particular limitation on the film-forming gas used for the gaseous phase growth, and there can be used a film-forming gas that is used for forming a film by an ordinary epitaxially growing method.

The above embodiment has dealt with the case where the arithmetic/control unit 3 for the processing furnace is separate from the arithmetic/control unit 31 for the rotary mechanical portion. Not being limited thereto only, however, there may be employed a single arithmetic/control unit equipped with both functions.

The above embodiment has dealt with the case where the opening degree of the pressure control valve 41 was adjusted based on the pressure in the processing furnace and the pressure in the rotary mechanical portion. Usually, however, the pressure in the processing furnace is set to be 20±0.2 Torr and, hence, the opening degree of the pressure control valve 41 may be adjusted based only upon the pressure in the rotary mechanical portion, so that the pressure $p_2$ in the rotary mechanical portion lies in a range 0.9 (20±0.2 Torr) $<p_2<20$±0.2 Torr.

EXAMPLE

Epitaxial wafers were prepared by using the apparatus for reduced-pressure epitaxial growth of the structure shown in FIG. 1 and by changing the ratio P ($P=p_2/p_1$) of the pressure $p_1$ in the processing furnace and the pressure $p_2$ in the rotary mechanical portion, and were measured for their concentration of Fe contamination.

Figure 3:
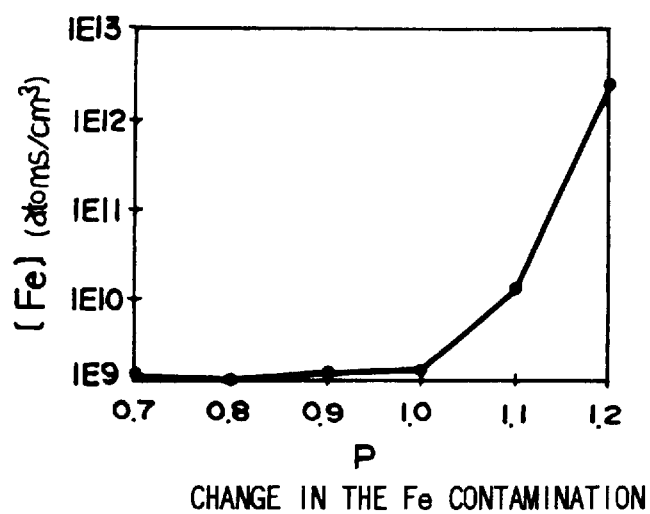
FIG. 3 is a diagram illustrating a change in the concentration of Fe contamination on the epitaxial wafer grown by varying the ratio P of the pressure in a processing furnace and the pressure in a rotary mechanical portion according to an Example.

The measured results were as shown in a graph of FIG. 3.

The conditions for preparing the epitaxial wafer other than the above conditions, were as follows:

Semiconductor wafer to be processed: silicon wafer having a diameter of 8 inches Rotational speed of the susceptor: 1500 rpm Temperature in the furnace: 1000±3° C.

Pressure in the furnace: 20±0.2 Torr

Film-forming gas: starting gas, $SiH_4$ 3000 slm, dopant, $B_2H_6$ 75 ppm, carrier, $H_2$ Growing time: 0.1 hour Under a condition of $P \leq 1.0$ as shown in FIG. 3, the concentration of Fe contamination on the wafer being processed is smaller than a limit of detection and remains nearly stable. When $P > 1.0$, on the other hand, the concentration of Fe contamination sharply increases with an increase in P.

From the standpoint of maintaining quality of the epitaxial wafer, therefore, it is important that P is controlled to be not larger than 1.0.

Next, 50 pieces of wafers were processed under the same conditions while varying the value P, and the amounts of the reaction product adhered on the walls in the rotary mechanical portion were measured.

Figure 4:
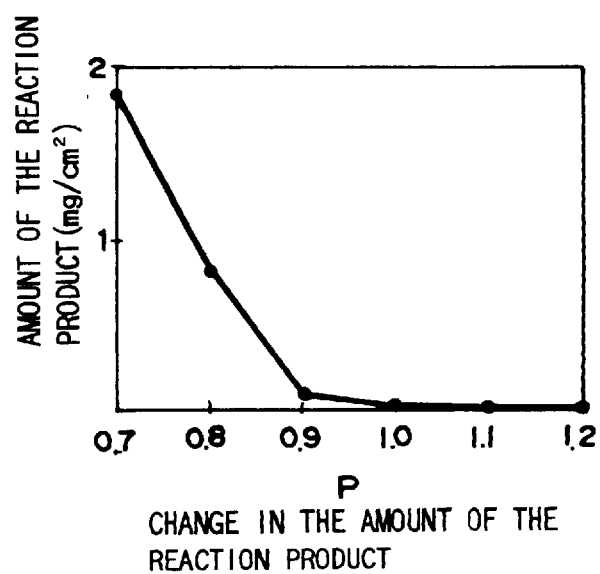
FIG. 4 is a diagram illustrating a change in the amount of the reaction product adhered onto the wall surfaces of the rotary mechanical portion of when the ratio P of the pressure in the processing furnace and the pressure in the rotary mechanical portion is varied according to the Example.

The measured results were as shown in a graph of FIG. 4.

When $P > 1.0$ as shown in FIG. 4, the reaction product is not almost adhered. When $0.9 \leq P \leq 1.0$, the amount of the reaction product adheres in a gradually increasing amount as P decreases. When $P < 0.9$, however, the amount of the reaction product adheres in sharply increasing amounts.

By taking the frequency of conducting the maintenance for the interior of the rotary mechanical portion into consideration, therefore, it is desired that P is controlled to be not smaller than 0.9.

In order to decrease the frequency of maintenance for the interior of the rotary mechanical portion while maintaining the quality yet avoiding the contamination on the wafer, therefore, it is important to maintain the ratio $P$ ($P = p_2/p_1$) of the pressure $p_1$ in the processing furnace and the pressure $p_2$ in the rotary mechanical portion to lie in a range $0.9 \leq P \leq 1.0$.

According to the apparatus for reduced-pressure epitaxial growth and the method of controlling the apparatus of the present invention, it is made possible to prevent the semiconductor wafers from being contaminated with metals and to decrease the frequency of conducting the cleaning (maintenance) for the rotary mechanical portion.

What is claimed is:

1. An apparatus for reduced-pressure epitaxial growth comprising a processing furnace, a susceptor disposed in the processing furnace and rotates while placing a semiconductor wafer thereon, a rotary mechanical portion for rotating the susceptor, a gas introduction pipe for introducing a film-forming gas into the processing furnace, and a gas exhaust pipe for exhausting the film-forming gas, the apparatus for reduced-pressure epitaxial growth further comprising a purging gas introduction pipe for purging the interior of the rotary mechanical portion, a purging gas exhaust pipe for exhausting the gas introduced through the purging gas introduction pipe, a pressure adjusting valve provided in the purging gas exhaust pipe, a pressure gauge for detecting the pressure in the rotary mechanical portion, and an arithmetic/control unit for executing an arithmetic operation based upon the detected pressure and for controlling the opening degree of the pressure adjusting valve provided in the purging gas exhaust pipe, so that the pressure in the rotary mechanical portion assumes a proper value.

2. An apparatus for reduced-pressure epitaxial growth according to claim 1, comprising a pressure gauge for detecting the pressure in the processing furnace, a pressure gauge for detecting the pressure in the rotary mechanical portion, and an arithmetic/control unit for executing the arithmetic operation based on the pressure in the processing furnace and the pressure in the rotary mechanical portion that are detected and for controlling the opening degree of the pressure adjusting valve provided in the purging gas exhaust pipe, so that the pressure in the rotary mechanical portion assumes a proper value.

3. An apparatus for reduced-pressure gaseous phase epitaxial growth according to claim 1, comprising a pressure adjusting valve provided in the gas exhaust pipe for exhausting the film-forming gas, a pressure gauge for detecting the pressure in the processing furnace, and an arithmetic/control unit for executing the arithmetic operation based on the pressure in the processing furnace and the pressure in the rotary mechanical portion that are detected and for controlling the opening degree of the pressure adjusting valve provided in the purging gas exhaust pipe, so that the pressure in the rotary mechanical portion assumes a proper value.

4. An apparatus for reduced-pressure gaseous phase epitaxial growth according to claim 2, comprising a pressure adjusting valve provided in the gas exhaust pipe for exhausting the film-forming gas, a pressure gauge for detecting the pressure in the processing furnace, and an arithmetic/control unit for executing the arithmetic operation based on the pressure in the processing furnace and the pressure in the rotary mechanical portion that are detected and for controlling the opening degree of the pressure adjusting valve provided in the purging gas exhaust pipe, so that the pressure in the rotary mechanical portion assumes a proper value.

* * * * *